United States Patent [19]

Horn et al.

[11] Patent Number: 5,484,688
[45] Date of Patent: Jan. 16, 1996

[54] PROCESS FOR THE PATTERNED METALLISATION OF STRUCTURED PRINTED CIRCUIT BOARDS

[75] Inventors: Klaus Horn, Hofheim; Jürgen Lingnau, Mainz; Gerald Schütze, Hofheim; Werner Hinter, Wiesbaden, all of Germany

[73] Assignee: Morton International, Inc., Chicago, Ill.

[21] Appl. No.: 242,759

[22] Filed: May 13, 1994

[51] Int. Cl.$^6$ ................................ B05D 1/32; B05D 3/00
[52] U.S. Cl. ........................ 430/311; 427/96; 427/98; 427/282; 427/314; 427/316; 427/384; 427/386; 430/330; 430/313
[58] Field of Search .................. 427/96, 98, 282, 427/316, 383.1, 384, 314, 372.2, 386, 385.5; 430/311, 313, 330, 324, 282–288

[56] References Cited

U.S. PATENT DOCUMENTS

| | | | |
|---|---|---|---|
| 4,003,877 | 1/1977 | Lipson | 427/98 |
| 4,064,287 | 12/1977 | Lipson | 427/96 |
| 4,234,626 | 11/1980 | Peiffer | 427/98 |
| 4,740,247 | 4/1988 | Hayes et al. | 34/42 |
| 5,264,324 | 11/1993 | Emmelius | 430/311 |
| 5,290,608 | 3/1994 | Grunwald et al. | 427/493 |
| 5,368,884 | 11/1994 | Yamagami et al. | 427/96 |

FOREIGN PATENT DOCUMENTS

| | | |
|---|---|---|
| 2108048 | 4/1994 | Canada . |
| 4234072 | 4/1994 | Germany . |

*Primary Examiner*—Shrive Beck
*Assistant Examiner*—Brian K. Talbot
*Attorney, Agent, or Firm*—Robert M. Didrick; Gerald K. White

[57] ABSTRACT

Described is a process for the patterned metallisation of structured printed circuit boards in which the fully structured printed circuit board is covered with a solder stop mask, with the solder contact locations being left open, the solder stop mask is heated under such conditions that complete hardening does not yet occur and the copper surface of the printed circuit board is practically not oxidized, metal is deposited out of an aqueous bath at the exposed solder contact locations and after the metal deposit operation the mask is heated sufficiently long to a sufficiently high temperature that the mask is completely hardened throughout. The incomplete pre-hardening step prevents the solution infiltrating under the mask in the metallisation operation and thereby loosening the adhesion thereof.

9 Claims, No Drawings

PROCESS FOR THE PATTERNED METALLISATION OF STRUCTURED PRINTED CIRCUIT BOARDS

The invention concerns a process for the patterned, preferably current-less metallisation of structured printed circuit boards or printed circuits which are covered by a solder stop mask, with soldering eyes being left open.

Circuits of that kind are usually subjected to a flow-soldering or wave-soldering process at the connecting locations which are intended for contacting purposes. In that process solder metal is deposited at the exposed contact locations which are not covered by the solder stop or resist mask, and the solder metal subsequently serves in part for the connection of superposed multi-layer circuits and in part for soldering components to the circuit. In order to achieve adequate resistance in respect of the solder stop mask under the conditions of the wave-soldering procedure and the further processing steps, it is necessary for the light-hardened solder stop mask to be subjected to an additional thermal hardening operation. In that operation the thermally cross-linkable compounds which are contained in that stencil, for example epoxy compounds, are cross-linked and thus form a sufficiently resistant structure. In more recent times there has been more of a tendency to change over to producing the contact locations by current-less metal deposit, in particular tin, nickel or gold, from suitable baths, instead of using the wave-soldering procedure. The current-less metal deposit process has the advantage that the deposited metal layers are thinner and substantially more uniform than when wave-soldering is used. It is employed in particular when electronic components are mounted directly on the surface of the printed circuit board (Service Mount Device (SMD)-process), for that procedure requires the printed circuit boards to have a particularly uniform and flat surface. That requirement cannot be fulfilled by soldering processes, for example by hot tinning. It has been found however that such baths have a tendency to pass under the hardened solder stop mask so that metal is deposited underneath the edges thereof. That is an undesirable phenomenon which results in local loosening of the solder stop masks, which is possibly manifested by the masks lifting off in the adhesive strip test.

The object of the present invention was to propose a process for the patterned metallisation of a structured printed circuit board which is covered in accordance with a pattern by a solder stop mask, which process uses the technique of current-less metallisation without the metallisation solution infiltrating under the solder stencil.

The basic starting point taken by the invention is a process for the patterned metallisation of structured printed circuit boards, in which the fully structured printed circuit board is covered with a solder stop mask, with the solder contact locations being left open, the solder stop mask is thermally hardened and metal is deposited from an aqueous bath at the exposed solder contact locations.

The process according to the invention is characterised in that prior to the metal deposit operation the solder stop mask is heated under such conditions that complete hardening does not yet occur and that the copper surface of the printed circuit board is practically not oxidised, and that after the metal deposit operation the mask is heated sufficiently long to a sufficiently high temperature that the mask is completely thoroughly hardened.

In the process according to the invention metal deposit is preferably effected in a current-less mode. It is in principle also possible galvanically by means of an electrical current, but in that case the contact connection is more difficult to produce. In particular tin, nickel and gold fall to be considered as metals to be deposited.

The first heating stage which is effected prior to the metal deposit operation results in incomplete thermal hardening of the solder stop mask. That hardening effect is sufficient for the mask resistance, that is required for the metal deposit step. On the other hand good adhesion of the mask to the surface of the printed circuit board is not reduced by that partial thermal hardening operation, or is so reduced only to such a slight degree that the metallisation solution does not infiltrate under the mask during the metal deposit operation.

As has been found, it is essential that no oxidative change in the copper surface of the circuit occurs in the first incomplete thermal hardening operation. That can already be achieved by virtue of the fact that the hardening operation is effected under less drastic conditions than is otherwise usual, that is to say at a lower temperature or only over a shorter period of time. In general this first hardening operation lasts for not longer than 15 minutes at a temperature in the range of from about 100°–150° C. Hardening times of from 5 to 12 minutes are preferred. The hardening operation can advantageously be effected with the exclusion of oxygen, for example in a protective gas atmosphere, for example of nitrogen or carbon dioxide.

The second hardening stage provides for complete hardening of the solder stop mask. Depending on the nature of the hardenable mixture it requires temperatures in the range of from about 120°–180° C. and times of from about 15–90 minutes, preferably 30–80 minutes.

Suitable materials for production of the solder stop masks are described for example in EP-A-418 733 and prior German patent application no. P 42 34 072.1. Such materials comprise, on the fully structured printed circuit board, a layer of a photopolymerisable mixture which contains:

a) a compound having at least one and preferably at least two terminal ethylenically unsaturated groups which can form a cross-linked polymer by radically initiated addition chain polymerisation, b) a water-insoluble polymeric binding agent which is soluble in aqueous-alkaline solutions, c) a radiation-activatable polymerisation initiator or a polymerisation initiator combination, d) a compound which can cross-link in a hot condition with itself, with the binding agent (b) or with the polymer of compound (a), e) possibly a cross-linking initiator, which can be activated by heat, for the compound (d), and f) possibly a finally divided mineral pigment.

In particular silicates or silicic acids are suitable as the mineral pigment. The amount of pigment is generally from 20 to 50% by weight and preferably from 25 to 40% by weight.

The monomeric polymerisable compounds used are generally esters of acrylic or methacrylic acid with polyvalent, preferably primary alcohols. The alcohol should preferably contain at least two hydroxy groups as the desired cross-linking effect is achieved by multiply unsaturated compounds. The esters of trimethylolpropane, trimethylolethane, pentaerythritol and dipentaerythritol are preferred examples. The monomer is generally contained in the mixture in an amount of from 10 to 35% by weight, preferably from 15 to 30% by weight, with respect to the total content of non-volatile components.

In particular polymers with lateral carboxyl or carboxylic acid anhydride groups are suitable as the polymeric binding agents. Particularly preferred are copolymers of acrylic and methacrylic acid, which as comonomers contain acrylic or methacrylic acid esters, styrenes, acrylo- or methacrylonitrile, acryl- or methacrylamide or vinylheterocyclene.

Numerous substances can be used as radiation-activatable polymerisation initiators. Examples are poly-nuclear quinones such as 2-ethylanthraquinone, acridine derivatives such as 9-phenylacridine or benzacridines, phenazine derivatives such as 9,10-dimethylbenz(a)phenazine, quinoxaline or quinoline derivatives such as 2,3-bis-(4-methoxyphenyl)quinoxaline or 2-styrylquinoline, quinazoline compounds or acylphosphine oxide compounds. Photoinitiators which include trihalomethyl groups which can be split by light, in particular compounds from the triazine or thiazoline series, are also advantageous.

The photoinitiators are generally added in proportions of from 0.1 to 15% by weight, preferably from 0.5 to 10% by weight, with respect to the non-volatile components of the mixture.

The mixture according to the invention also includes a thermally cross-linkable compound. Bivalent or polyvalent epoxy compounds are preferred. Suitable examples are in particular bisglycidylethers of bivalent alcohols and phenols, such as for example of bisphenol A, polyethylene glycol and polypropylene glycol ethers of bisphenol A, butane-1,4-diol, hexane-1,6-diol, polyethylene glycol, polypropylene glycol or polytetrahydrofuran.

The cycloaliphatic epoxy compounds described in prior German patent application no. P 42 34 072.1 can also be advantageously used. They are compounds which contain at least one cycloaliphatic ring and at least one epoxy group, wherein the epoxy groups are preferably not produced by hydrogen chloride separation from a chlorohydrin.

Bisglycidylethers of trivalent alcohols, for example glycerin, can also be used. The epoxides are usually added to the mixture in an amount of from about 10 to 30% by weight, preferably from 12 to 25% by weight, with respect to the non-volatile components of the mixture.

Further suitable thermally cross-linkable compounds are those with condensatable N-hydroxymethyl or N-alkoxymethyl groups. Examples are hexamethoxymethyl- and hexahydroxymethylmelamine.

If epoxy compounds are used as the cross-linking agent, the mixture preferably contains a hardener or addition initiator for epoxy groups. The hardener is preferably a nitrogen base, for example triethylamine, 1,4-diazabicyclo[2,2,2]octane (Dabco), dibutylamine or higher-alkylated mono-, di- and triamines on an aliphatic basis. The amount of the base is generally between 0.15 and 1.5% by weight, preferably between 0.2 and 1.0% by weight.

The mixture is generally dissolved in an organic solvent and applied from that solution to the surface of the structured printed circuit board which normally comprises copper conductor tracks on a board of insulating material, and dried. Further processing is effected by exposure of the layer in accordance with the pattern required, in which case the soldering eyes are covered over, and washing off the unexposed regions of the layer with a developer.

Suitable developers are preferably aqueous-alkaline solutions, for example of alkali metal hydroxides, carbonates or silicates, to which optionally small amounts, for example up to 10% by weight, of water-miscible organic solvents or wetting agents can be added.

Fully developed solder masks of the described type are subjected to a temperature treatment prior to the soldering process. In that treatment for example the carboxyl groups of the binding agent react with the polyfunctional epoxide to form an interpenetrating network. An integral constituent of that network is also the mineral solid.

In the case of the process according to the invention that heat treatment is effected in two stages. In that respect it is crucial that the first stage is effected under such conditions that the copper surface is still not oxidised or is not oxidised to a considerable degree. More specifically it is possible to ascertain when that is the case, by means of simple tests. As mentioned above, a treatment of less than 15 minutes at 150° C. is generally harmless. The risk of oxidation is further reduced by the exclusion of oxygen; therefore in many cases the specified control values can be exceeded without detriment. On the other hand thermal hardening should occur to a certain minimum degree as in that case the resistance of the masks relative to the metallisation baths which are usually caused to act at elevated temperature, for example between 50° and 100° C., is better. Masks which are not thermally pre-hardened at all are easily leached out in those baths and the baths are contaminated by the corresponding soluble layer constituents. In general hardening should be effected for from about 5 to 12 minutes at a temperature in the range of from about 120° to 150° C.

The metallisation is then effected in per se known manner using commercially available metallisation baths, in which case the metallisation operation is usually still preceded by various cleaning and initial etching steps. In particular tin, nickel and/or gold baths are used as the metallisation baths. Suitable baths and processes are described for example in "(R)Nimuden-Chemisch Nickel für anspruchsvolle Anwendungen" by Dr. Schenzel, Degussa-Hausmitteilungen, 1992; "Electroless Plating Fundamentals And Applications" by Glenn O. Mallory, American Electroplaters and Surface Finisher Society, 1990; and "Gold als Oberfläche" by F. H. Reid and W. Goldie, Leuze-Verlag, Saulgau, 1982.

Thereafter the second thermal hardening stage is effected in again the usual manner to the above-mentioned extent. The board can then be fitted with electronic components in known manner.

The following Examples describe the execution of the process according to the invention. If not otherwise specified, percentages and quantitative relationships are in units of weight. The amounts are mostly specified in parts by weight (parts wt).

EXAMPLE 1

Using a cylindrical vessel, the following were dissolved in 123.9 parts wt of 3-methoxybutan-1-ol using a high-speed fast agitator:

112.5 parts wt of pentaerythritol triacrylate, 128.9 parts wt of trimethylolpropane triacrylate, 27.5 parts wt of 9-phenylacridine, 12.4 parts wt of neozapon green, 1.2 parts wt of a blue azo dyestuff, and 2.5 parts wt of triethylene diamine.

Then, over a period of 30 minutes, 396.7 parts wt of a silicatic pigment which is a natural agglomerate of corpuscular quartz and laminar kaolinite was scattered into the agitated solution. The procedure then involved the addition to that suspension of 694.2 parts wt of a 53% solution of a terpolymer of styrene, methacrylic acid and n-hexylmethacrylate (32:15:3) and the mixture was well homogenised.

The viscous lacquer was crushed in a glass ball mill and then filtered through a 160 μm V2A-mesh pressure filter and put into a container. 252 parts wt of an epoxidated phenol formaldehyde resin with an epoxide equivalent weight of 172 to 179 was dissolved in 148 parts wt of 3-methoxybutanol by means of a anchor-type agitator. After an agitation time of 15 minutes there was a clear solution with a 63% solid content.

100 parts wt of the first solution was intensively mixed with 22.3 parts wt of the epoxy resin solution. The solid content of the mixture was 67.5%.

A board measuring 24×36 cm of epoxy resin glass cloth with a circuit pattern applied to both sides thereof, comprising copper tracks which are from 0.2 to 1.5 mm in width and from 50 to 90 µm thick and with through-contacted bores was coated over its entire surface with the above-described solution by means of a semi-automatic screen printing machine. The circuit board when coated in that way was left at ambient temperature for 5 minutes and then dried for 7 minutes in a circulatory air drying cupboard at 80° C. After cooling down to ambient temperature the coated circuit board was exposed in accordance with the required pattern through a film pattern member.

The development operation was effected within 90 seconds in a through-run spraying installation with a 1% aqueous soda solution at 30° C. with a 1.2 bar spray pressure.

After washing with water the developed board was dried in a hot air through-run drier and then reheated for 10 minutes at 150° C. in a circulatory air drying oven. The partially hardened board was treated as follows:

It was immersed for 3 minutes at ambient temperature in a commercial acid cleaning bath (pH-value <1), rinsed with water, then immersed for 2 minutes at ambient temperature in a commercial micro-etching bath (pH-value <1), again rinsed, pickled for 1 minute at ambient temperature in 3% sulphuric acid, rinsed again, activated for 5 minutes in a $PdCl_2$-solution, rinsed, then again pickled for 1 minute at ambient temperature in 3% sulphuric acid, thereafter treated for 30 minutes at 65° C. in a commercial nickel bath (pH-value 5.5), rinsed again and dried. After that treatment a 5 µm thick nickel layer was deposited on the exposed contact locations. The nickel deposit was exactly defined by the solder stop mask, it was not possible to see any infiltration under same at the edges. If a commercial pressure-sensitive adhesive strip is pressed onto the edge zone of the solder stop mask and then torn off with a jerk, the mask remains clinging undamaged to the printed circuit board. The board was then fully hardened by heating for 1 hour at 150° C.

A total of 10 boards were treated in the same baths. After that the baths exhibited no colouration or contamination.

Comparative Example 1

A printed circuit was produced by the photoresist procedure, as described in Example 1. After the developing operation it was heated for 1 hour at 150° C., after which the solder stop mask was completely hardened. A 5 µm nickel layer was then deposited on the board in the same manner as in Example 1. Nickel had been deposited under the edges of the mask, of irregular width. Parts of the edge zones of the mask were removed from the substrate when the adhesive strip test set out in Example 1 was carried out.

After a treatment of 10 boards which had been subjected to preliminary treatment in the same manner the baths were neither coloured nor contaminated.

Comparative Example 2

A printed circuit was produced as described in Example 1. However after the developing operation and prior to the metal deposit operation it was not subjected to any heat treatment. A 5 µm thick nickel layer was deposited, as in Example 1. The board was then hardened for 1 hour at 150° C.

It was not possible to see any infiltration of deposited nickel under the mask. The mask also remained undamaged in the adhesive strip test.

After the treatment of 10 boards in the same baths, the baths, in particular the nickel bath, were clearly coloured and clouded, which was to be attributed to constituents which had been dissolved out of the unhardened solder stop mask.

EXAMPLE 2

A printed circuit was produced and prepared for the metallisation operation, as described in Example 1. The nickel-plating operation was effected in a commercial nickel bath which contained 7 g/l of Ni and 32 g/l of hypophosphite and which had a pH-value of 4.8. After immersion for 20 minutes in the bath at a temperature of 90° C., 5 µm of nickel had become deposited. After rinsing the board was dipped into a commercial gold bath which contained 4 g/l of Au and had a pH-value of 4.0. The board was dipped for 20 minutes into the gold bath at a temperature of 85° C., after which a gold layer of 0.1 µm was deposited.

The board was heated for 10 minutes at 150° C. as described in Example 1 before the current-less nickel-plating and gold-plating steps. After the metal deposit operation it was not possible to see any infiltration under the solder stop mask. The mask remained undamaged in the adhesive strip test. The baths exhibited no colouration or contamination after the processing of 10 boards.

Comparative Example 3

A printed circuit was produced as described in Example 2, nickel-plated and gold-plated. However, prior to the metallisation operation, similarly to comparative Example 1, the board was heated at 150° C. for 1 hour. Similarly to comparative Example 1, nickel and gold had become deposited under the edges of the solder stop mask. Parts of the mask were torn off in the adhesive strip test. The baths were not coloured or contaminated after the processing of 10 boards.

Comparative Example 4

As in Example 2, a printed circuit was produced, nickel-plated and gold-plated. In this case however, similarly to comparative Example 2, no reheating whatsoever of the board was effected prior to the metallisation operation. As in Example 2, no metal had infiltrated under the mask; the mask adhered firmly to the circuit in the adhesive strip test. The nickel and gold bath were clearly coloured and clouded after the processing of 10 boards.

Similar results were obtained when structured printed circuit boards covered with solder stop masks were coated with tin using a current-less procedure, instead of nickel.

We claim:

1. A process for patterned metallization of structured printed circuit boards comprising copper tracks in which a fully structured printed circuit board is covered with a solder stop mask but leaving solder contact locations open, the solder stop mask is thermally hardened and metal is deposited from an aqueous bath at the exposed solder contact locations, characterized in that, prior to the metal deposition, the solder mask is heated under such conditions that complete hardening does not yet occur, the surface of the copper tracks is not oxidized, and that, after the metal deposition, the mask is heated sufficiently long to a sufficiently high temperature that the mask is completely hardened throughout.

2. A process according to claim 1 characterized in that the solder stop mask is produced by applying to the structured printed circuit board surface a photopolymerizable layer comprising a mixture which can be hardened by radiation and by heating, exposing the layer to radiation in accordance with the pattern and removing the unexposed regions of the layer by washing with a developer.

3. A process according to claim 1 characterized in that the metal is deposited in an electroless mode out of the aqueous bath.

4. The process according to claim 1 or claim 3 characterized in that the metal is selected from the group consisting of tin, nickel, and gold.

5. A process according to claim 2 characterized in that the mixture which can be hardened by exposure to radiation and by heating contains:

a) a compound having at least one terminal ethylenically unsaturated group which can form a cross-linked polymer by radical initiated addition chain polymerization, b) a water-insoluble polymeric binding agent which is soluble in aqueous alkaline solutions, c) a radiation activatable polymerization initiator or a polymerization initiator combination, d) a thermally cross-linkable compound which can cross-link with itself, with the binding agent (b) or with the polymer of the compound (a), and e) optionally a thermally activatable cross-linking initiator for the compound (d).

6. A process according to claim 1 characterized in that prior to the metal deposit operation the solder stop mask is heated for up to 15 minutes to a temperature in the range of from 100° to 150° C.

7. A process according to claim 1 or claim 6 characterized in that the solder stop mask is heated prior to the metal deposit operation, with the exclusion of oxygen.

8. A process according to claim 7 characterized in that the solder stop mask is heated prior to the metal deposit operation under a protective gas atmosphere.

9. A process according to claim 1 characterized in that the solder stop mask is heated after the metal deposit operation for from 15 to 90 minutes to a temperature in the range of from 120° to 180° C.

* * * * *